United States Patent
Wang et al.

(10) Patent No.: US 12,047,695 B2
(45) Date of Patent: Jul. 23, 2024

(54) PHOTOELECTRIC SENSOR, RANDOM ACCESSIBLE ACTIVE PIXEL CIRCUIT, IMAGE SENSOR AND CAMERA

(71) Applicant: SUN YAT-SEN UNIVERSITY, Guangzhou (CN)

(72) Inventors: Kai Wang, Guangzhou (CN); Yihong Qi, Guangzhou (CN)

(73) Assignee: Sun Yat-Sen University, Guangzhou (CN)

(*) Notice: Subject to any disclaimer, the term of this patent is extended or adjusted under 35 U.S.C. 154(b) by 118 days.

(21) Appl. No.: 17/914,095

(22) PCT Filed: May 15, 2020

(86) PCT No.: PCT/CN2020/090525
§ 371 (c)(1),
(2) Date: Sep. 23, 2022

(87) PCT Pub. No.: WO2021/189619
PCT Pub. Date: Sep. 30, 2021

(65) Prior Publication Data
US 2023/0116531 A1    Apr. 13, 2023

(30) Foreign Application Priority Data
Mar. 23, 2020 (CN) .......................... 202010208160.0

(51) Int. Cl.
*H04N 25/57* (2023.01)
*H01L 27/146* (2006.01)

(52) U.S. Cl.
CPC ......... *H04N 25/57* (2023.01); *H01L 27/1463* (2013.01); *H01L 27/1464* (2013.01); *H01L 27/14643* (2013.01)

(58) Field of Classification Search
CPC ........... H01L 27/14643; H01L 27/1464; H01L 27/1463; H01L 27/14612; H04N 25/77; H04N 25/57; H04N 25/51
(Continued)

(56) References Cited

U.S. PATENT DOCUMENTS 6,576,966 B1    6/2003 Bulucea
8,319,262 B2 *  11/2012 Janesick ........... H01L 27/14609
                                                         257/292
(Continued)

FOREIGN PATENT DOCUMENTS

CN      101226962      7/2008
CN      101461045      6/2009
(Continued)

OTHER PUBLICATIONS

PCT/ISA/210 Search Report issued on PCT/CN2020/090525, Dec. 21, 2020 pp. 6.
(Continued)

*Primary Examiner* — Pritham D Prabhakher
(74) *Attorney, Agent, or Firm* — The Farrell Law Firm, P.C.

(57) ABSTRACT

Provided is a photoelectric sensor, a random accessible active pixel circuit, an image sensor and a camera. A photoelectric sensor comprises a doped region, a substrate, a doped source region, a doped drain region, and two isolation regions; wherein the doped region is arranged on a bottom surface of the substrate so as to form a photodiode; a cathode of the photodiode is formed in the doped region and is connected to a positive voltage to make the photodiode work in a reverse bias region; wherein the doped source region and the doped drain region are spaced apart on top of the substrate so as to form a field effect transistor; a source is formed on a top surface of the doped source region,
(Continued)

and a drain is formed on the top surface of the doped drain region; wherein the two isolation regions are arranged on opposite sides of the substrate, and extend from the doped source region and the doped drain region to the doped region; wherein a gate dielectric layer and a gate between the doped source region and the doped drain region are configured sequentially upwards from the top surface of the substrate; the gate is connected to a voltage to make the field effect transistor select wide dynamic range mode or high gain mode.

16 Claims, 6 Drawing Sheets

(58) Field of Classification Search
USPC .......................................................... 348/294
See application file for complete search history.

(56) References Cited

U.S. PATENT DOCUMENTS

| | | | | |
|---|---|---|---|---|
| 8,466,530 | B2* | 6/2013 | Chen | H01L 27/1461 257/E31.127 |
| 8,748,952 | B2* | 6/2014 | Chen | H01L 27/14689 438/73 |
| 10,079,325 | B2* | 9/2018 | Aurola | H01L 27/14616 |
| 2006/0084195 | A1* | 4/2006 | Lyu | H01L 27/14603 257/E27.131 |
| 2010/0091163 | A1* | 4/2010 | Liao | H04N 3/155 257/E31.127 |
| 2010/0245809 | A1* | 9/2010 | Andreou | H01L 31/107 257/292 |
| 2011/0024808 | A1* | 2/2011 | Janesick | H01L 27/14643 257/292 |
| 2013/0001722 | A1* | 1/2013 | Chen | H01L 27/14689 257/E31.127 |
| 2013/0249037 | A1* | 9/2013 | Chen | H01L 27/1463 257/432 |
| 2015/0243696 | A1* | 8/2015 | Chien | H01L 27/14685 257/435 |
| 2016/0064446 | A1* | 3/2016 | Lee | H01L 27/14603 257/368 |
| 2016/0150174 | A1* | 5/2016 | Hynecek | H01L 27/1463 257/233 |
| 2016/0240720 | A1* | 8/2016 | Aurola | H01L 27/1461 |
| 2019/0115386 | A1* | 4/2019 | Ma | H01L 27/14629 |

FOREIGN PATENT DOCUMENTS

| | | |
|---|---|---|
| CN | 101471360 | 7/2009 |
| CN | 102709302 | 10/2012 |
| CN | 103208521 | 7/2013 |

OTHER PUBLICATIONS

PCT/ISA/237 Written Opinion issued on PCT/CN2020/090525, Dec. 21, 2020, pp. 3.

* cited by examiner

PHOTOELECTRIC SENSOR, RANDOM ACCESSIBLE ACTIVE PIXEL CIRCUIT, IMAGE SENSOR AND CAMERA

CROSS REFERENCE TO RELATED APPLICATION(S)

This application is a National Phase entry of PCT Application PCT/CN2020/090525, filed on May 15, 2020, and claims priority to Chinese Application No. 202010208160.0, filed on Mar. 23, 2020, the entire contents of each which are incorporated herein by reference.

TECHNICAL FIELD

The following relates to a field of an electronic technology, in particular to the field of a photoelectric sensor, a random accessible active pixel circuit, an image sensor and a camera.

BACKGROUND OF INVENTION

A phototransistor is a common integrated photoelectric sensor comprising a photoelectric sensor and a photocurrent amplification. A traditional phototransistor is fabricated by front side illumination (FSI) bipolar process technology where the incident light needs to pass through passivation layer, interconnected insulation layers, and metal layers to reach the photosensitive area and to be absorbed. Consequently, the quantum efficiency will decrease for the light transmittance loss caused by light reflection on dielectrics or metals, and alternative light path due to the refraction through a plurality of dielectric layers.

Furthermore, as shown in FIG. 1 and FIG. 2, the traditional phototransistor can be either NPN type or PNP type. Commonly, the collector of a phototransistor is biased by a constant positive potential $V_{DD}$, the emitter is grounded, and the base is floated for photo sensing. When the light irradiates on the base of the transistor, photocurrent is generated between the base and the collector, and is amplified by the intrinsic gain of the phototransistor. However, a traditional phototransistor has larger size as compared with a CMOS device, and the traditional phototransistor is incompatible with standard CMOS process, additionally, cannot be used in high-resolution imaging applications.

SUMMARY OF THE INVENTION

In order to resolve the problems above, embodiments of the disclosure provide a photoelectric sensor, a random accessible active pixel circuit, an image sensor and a camera.

One embodiment of the present invention is a photoelectric sensor including: a doped region, a substrate, a doped source region, a doped drain region; and two isolation regions;
the doped region is on the bottom of the substrate so as to form a photodiode; a cathode of the photodiode is formed in the doped region and is biased by a positive bias to make the photodiode work in a reverse-biased region;
the doped source region and the doped drain region are separated apart on top of the substrate so as to form a field-effect transistor; a source is formed on a top surface of the doped source region, and a drain is formed on the top surface of the doped drain region;
the two isolation regions are arranged on opposite sides of the substrate, and extend from the doped source region and the doped drain region to the doped region; so as to isolate adjacent pixels or adjacent sensors;
a gate dielectric layer and a gate between the doped source region and the doped drain region are placed sequentially on the top surface of the substrate; the gate is connected to a voltage to make the field-effect transistor work in a wide dynamic range mode or a high gain mode.

One embodiment of the present invention is a random accessible active pixel circuit, wherein it comprises a selection transistor and aforementioned photoelectric sensor; the drain of the selection transistor is electrically connected with the source of the photoelectric sensor, and the source of the selection transistor serves as an output of the circuit; and the cathode is connected to the drain in series in the photoelectric sensor.

One embodiment of the present invention is an image sensor comprising aforementioned random accessible active pixel circuit.

One embodiment of the present invention is a camera comprising aforementioned image sensor.

The present invention has following technical advantages as compared to the prior art: In the present invention, it comprises a doped source region, a doped drain region, a gate dielectric layer and a gate which are formed on the top surface of a substrate. A doped region and a cathode are formed on the bottom surface of the substrate and form an integrated back-side illumination photoelectric sensor consisting of a photodiode and a field-effect transistor on a common substrate, whereby solving the drawbacks of the phototransistor in the related art, such as low quantum efficiency, large size, and inability to be applied to image sensors. It can also be compatible with the fabrication process of back-side illumination CMOS image sensor, and can be fabricated into small size devices for image sensor. In addition, for some applications (including but is not restricted to image sensor, camera, display device), photosensitive devices usually are an integration of multiple photoelectric sensors. In this way, multiple photoelectric sensors are generally arranged in an array, and the photoelectric sensors are arranged close to each other inevitably. In this situation, a crosstalk will be generated between the adjacent photoelectric sensors. Therefore, by arranging the two isolation regions, adjacent pixels or adjacent sensors can be isolated to avoid crosstalk between adjacent pixels or adjacent sensors.

It is appreciated that the summary hereinbefore and the detailed description hereinafter are exemplary and explanatory only and do not limit coverage of the invention.

DETAILED DESCRIPTION OF THE INVENTION

Embodiment of the present invention are described in detail hereinafter with reference to the drawings. In the detailed description below, the same numerals in different drawings refer to the same or similar elements, unless otherwise indicated. The embodiments described in the illustrative examples below are not intended to be exhaustive. They are merely examples of apparatus and methods consistent with some aspects of the invention, as recited in the appended claims.

The terms used in the present invention is for the purpose of describing particular embodiments only and is not intended to limit the present invention. As used in the description and the appended claims, the singular forms "a," "aforementioned" and "the" are intended to include plural forms, unless otherwise defined. It will be appreciated that the term "and/or" as used herein is interpreted to include any or all possible combinations of one or more of the listed items.

Figure 1:
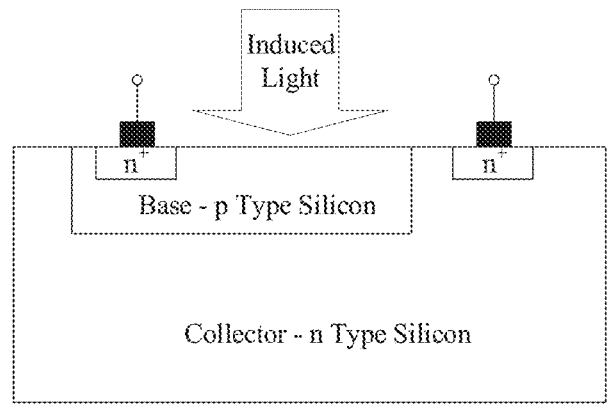
FIG. 1 is a schematic diagram of a traditional phototransistor.
Figure 2:
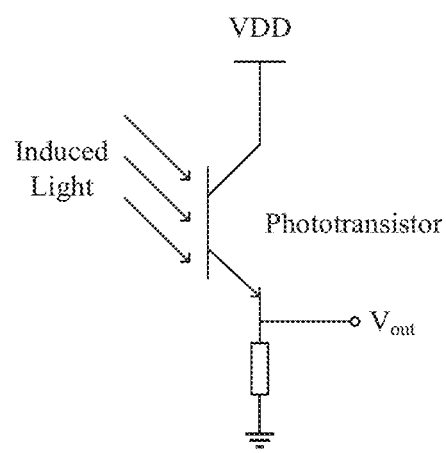
FIG. 2 is the equivalent circuit diagram of the traditional phototransistor.
Figure 3:
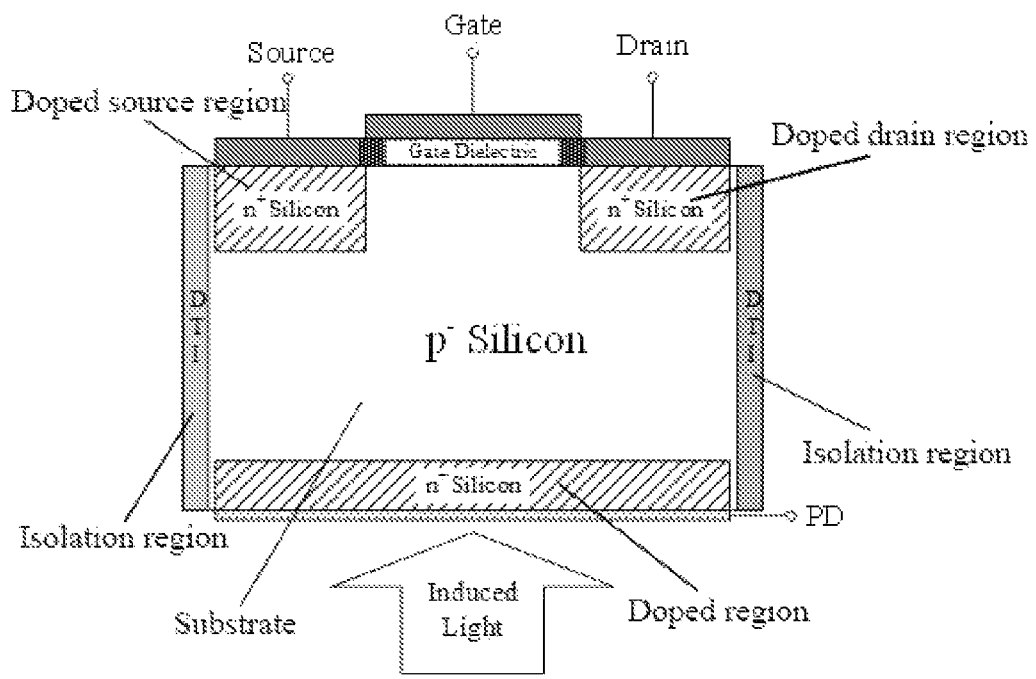
FIG. 3 is a schematic diagram of a photoelectric sensor according to an embodiment of the present invention.
Figure 4:
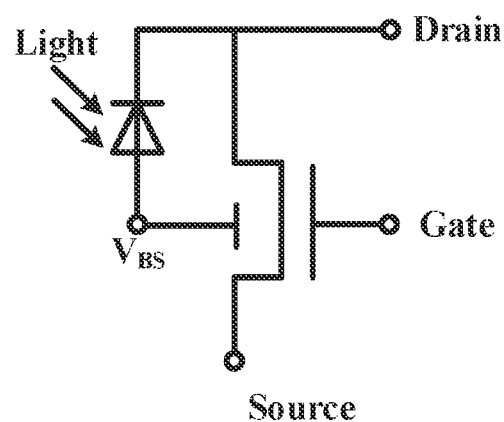
FIG. 4 is an equivalent circuit diagram of a photoelectric sensor according to the embodiment of the present invention.

In the present invention, in order to resolve the drawbacks of phototransistor in the prior arts, such as low quantum efficiency, large form factor, and incapable of being applied to image sensors, provided is a photoelectric sensor, wherein a doped source region, a doped drain region, a gate dielectric layer and a gate are formed on a top surface of a substrate, while a doped region and a cathode are formed on the bottom surface of the substrate, so as to form an integrated back-side illumination photoelectric sensor consisting of a photodiode and a field-effect transistor on a common substrate, whereby resolving the mentioned drawbacks of phototransistor in the prior arts. It can be also compatible with the fabrication process of back-side illumination CMOS image sensor, and can be fabricated into small size devices aiming for an image sensor application. The photoelectric sensor provided by the invention is described as follows:

As shown in FIG. 3, the present invention of the photoelectric sensor comprises a doped region, a substrate, a doped source region, a doped drain region, and two isolation regions. The doped region is arranged on a bottom surface of the substrate so as to form a photodiode; a cathode of the photodiode is formed in the doped region and is connected to a positive voltage to make the photodiode work in a reverse-biased region. The doped source region and the doped drain region are spaced apart on top of the substrate so as to form a field-effect transistor; a source is formed on the top surface of the doped source region, and a drain is formed on the top surface of the doped drain region. The two isolation regions are arranged on opposite sides of the substrate, and extend from the doped source region and the doped drain region to the doped region, i.e. from top to bottom in FIG. 3, so as to isolate adjacent pixels or adjacent sensors. A gate dielectric layer and a gate between the doped source region and the doped drain region are placed sequentially on the top surface of the substrate; the gate is connected to a voltage to make the field-effect transistor work in a wide dynamic range mode or a high gain mode.

In the embodiment of the present invention, the doped region and the substrate on the back-side of the photoelectric sensor form a photodiode which is used to detect incident light and convert visible light into photo-charge; in the meantime, the doped source region, the doped drain region and the substrate on the front-side of the photoelectric sensor together form a field-effect transistor (FET) which is used to amplify the photocurrent generated by the photodiode. The doped source region, doped drain region and substrate on the front-side of the photoelectric sensor form the source region, drain region and channel region of the field-effect transistor respectively, and the gate dielectric layer and gate on the top surface of the substrate form the gate dielectric layer and gate of the field-effect transistor respectively, whilst the source formed on the top surface of the doped source region and the drain formed on the top surface of the doped drain region are the source electrode and the drain electrode of the field-effect transistor, respectively. Moreover, in subsequent applications, photosensitive devices, e.g., image sensor or a camera or display device, may require an integration of multiple photoelectric sensors, therefore the photoelectric sensors are generally arranged in an array. In this situation, the photoelectric sensors must be arranged one by one, and a crosstalk will be generated between the adjacent photoelectric sensors. Therefore, by arranging the two isolation regions, adjacent pixels or adjacent sensors can be isolated from each other to avoid the crosstalk.

In this embodiment, the isolation region can be produced by a deep trench isolation technology or capacitance deep trench isolation technology. Certainly; this is not limited to such technologies.

In this embodiment, the substrate can be a lightly doped P-type substrate or a lightly doped N-type substrate. In the embodiments where the substrate is a P-type substrate, the doped region, the doped source region and the doped drain region are all heavily doped N-type regions; in the embodiments where the substrate is an N-type substrate, the doped region, the doped source region and the doped drain region are all heavily doped P-type regions.

The principle of the photoelectric sensor according to the embodiment of the present invention will be described based on a lightly doped P-type silicon substrate as follows:

Note that in the photoelectric sensor device, a constant positive voltage is connected to the cathode to make the photodiode work in a reverse-biased region.

Note that when the incident light irradiates on the photodiode, it is converted into electron hole pairs. Under the effect of a built-in electric field of the photodiode, the holes are swept into the substrate, making the potential of the substrate rises. Then a forward body bias is generated in the field-effect transistor and this body effect will adjust the operating threshold voltage of the field-effect transistor. When the field-effect transistor is in the off-state region, the inversion layer channel is not formed. Note that the doped source region-substrate-doped drain region in the field-effect transistor can be equivalent to an (N+)P(N+) Bipolar Junction Transistor (BJT), where the drain electrode of the field-effect transistor can be regarded as the collector of the BJT, the substrate can be regarded as the base of the BJT, and the source electrode can be regarded as the emitter of the BIT. The photo current generated by the photodiode can be regarded as a forward hole current flowing into the base of the BJT. Hereby the BJT operated in the amplification region amplifies the forward hole current to obtain the output current IDs:

$$I_{DS} = \beta I_{PD} = \beta I_S \left[ \exp\left(\frac{V_{BS}}{kT/q}\right) - 1 \right]$$

$$= \beta q \eta (1-R)(1-e^{-\alpha d}) \cdot A \cdot \frac{P_{in}}{h\nu}$$

$$= \frac{1}{\frac{D_E}{D_B} \cdot \frac{N_B}{N_E} + \frac{1}{2}\left(\frac{L}{L_B}\right)^2} \cdot q\eta(1-R)(1-e^{-\alpha d}) \cdot A \cdot \frac{P_{in}}{h\nu}$$

Equation (1)

In equation (1), $\beta$ is the gain of the BJT or the factor of proportionality between the base current and the collector current of a BJT, $I_{PD}$ is the photo current of the photodiode, $I_S$ is the reverse saturation current of the photodiode, k is the Boltzmann constant, T is the absolute temperature, q is the electron charge, $\eta$ is the internal quantum efficiency, R is the reflection loss of the incident light in the device, $\alpha$ is the light absorption coefficient of the substrate material, d is the depletion depth, A is the area of the photodiode, $P_{in}$ is the power of the incident light, h is Planck constant, $\nu$ is the frequency of the incident light, $D_E$ is a minority carrier diffusion coefficient in the source region, $N_E$ is a impurity doping concentration in the source region, $L_E$ is a minority carrier diffusion length in the source region, $D_B$ is a minority carrier diffusion coefficient in the substrate region, $N_B$ is a doping concentration in the substrate region, and $L_B$ is a minority carrier diffusion length in the substrate region, and L is the channel length between the source region and the drain region. $V_{BS}$ is the substrate voltage which varies with the intensity of the incident light on the photodiode:

$$V_{BS} = \frac{kT}{q} \cdot \ln\left(1 + \frac{I_{PD}}{I_S}\right)$$

Equation (2)

When the gate voltage is increased to make the field-effect transistor work in the sub-threshold region, the operating threshold voltage of the field-effect transistor decreases and the output current increases. The relationship between the output current and the intensity of the incident light is as follows:

Equation (3)

$$I_{DS} = \mu_N C_{ox} \frac{W}{L} \left(\frac{kT}{q}\right)^2$$

$$\exp\left(\frac{V_{GS} - \gamma \sqrt{2\phi_{fp} - kT/q \cdot \ln\left(1 + \frac{q\eta(1-R)(1-e^{-\alpha d}) \cdot A \cdot \frac{P_{in}}{h\nu}}{I_S}\right)}}{nkT/q}\right) \left[1 - \exp\left(\frac{-V_{DS}}{kT/q}\right)\right]$$

In equation (3), $\mu_N$ is the field effect mobility of the field-effect transistor, $C_{ox}$ is the capacitance of the gate dielectric layer, W and L are the channel width and length of the field-effect transistor respectively, $V_{GS}$ is the gate voltage, $\gamma$ is the body effect coefficient, $\Phi_{fp}$ is the potential difference between the Fermi level and the intrinsic Fermi level, n is an inverse slope of the sub-threshold current, and the relationship between the inverse slope and the sub-threshold swing S is $$S = \frac{n \times kT \times \ln 10}{q}.$$

Figure 5:
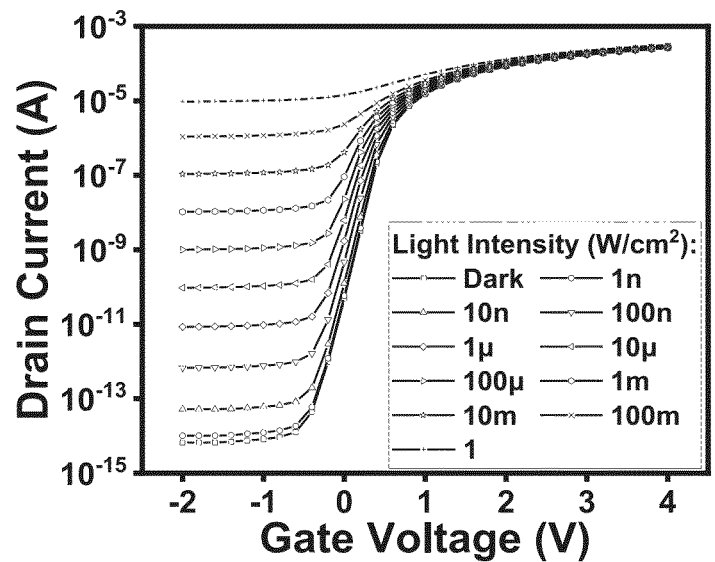
FIG. 5 is a graph illustrating the relationship between the output current of photoelectric sensor and the light intensity of incident light according to an embodiment of the present invention.
Figure 6:
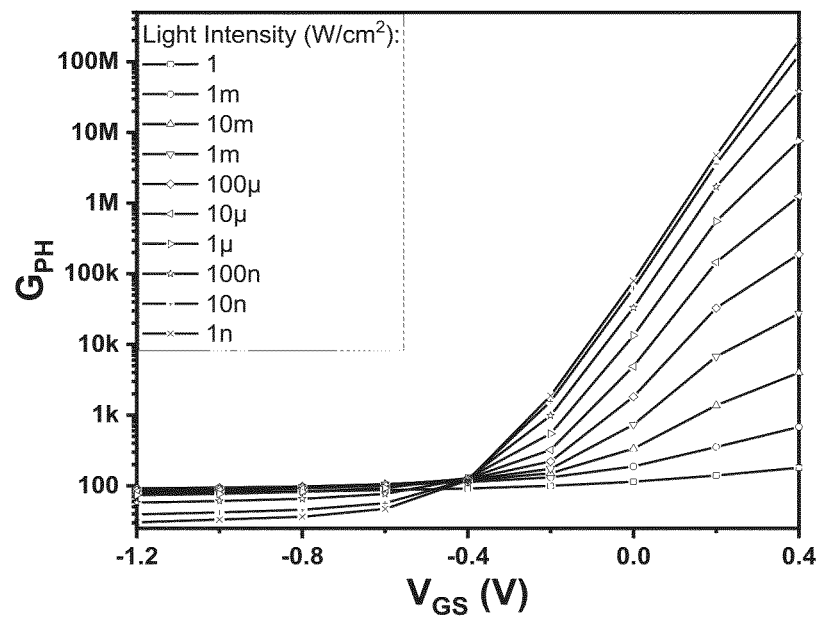
FIG. 6 is a graph illustrating the relationship between the photoconductive gain and the gate voltage of a photoelectric sensor under different light intensities according to an embodiment of the present invention.
Figure 7:
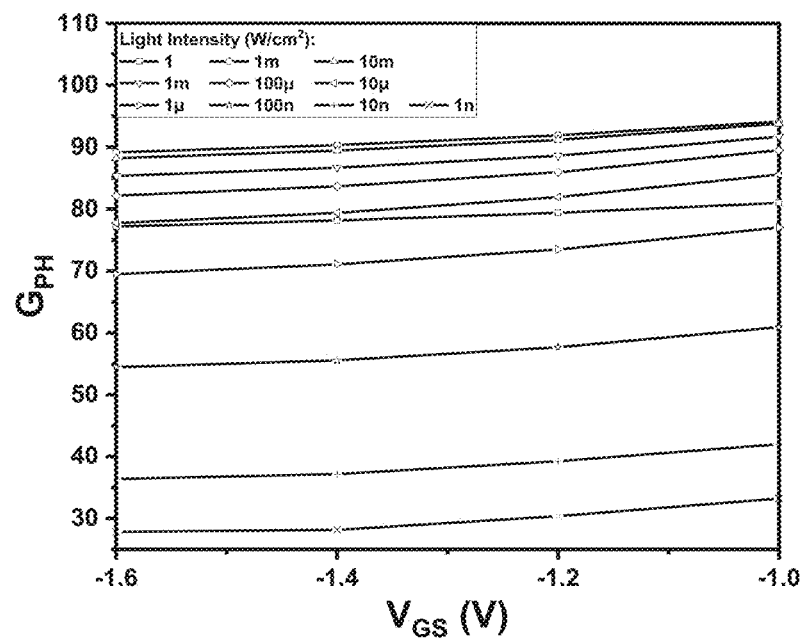
FIG. 7 is a schematic diagram of the simulation illustrating the optical gain of a photoelectric sensor operating in an off-state region according to an embodiment of the present invention.
Figure 8:
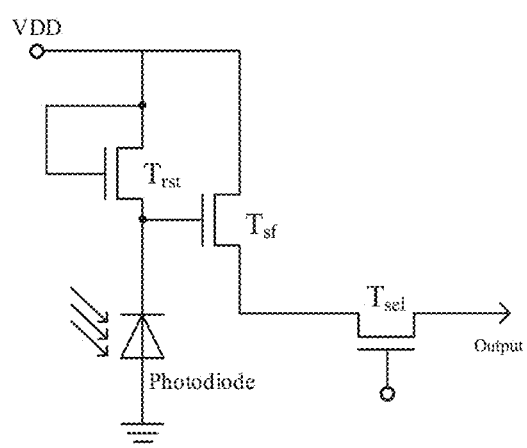
FIG. 8 is a schematic diagram of the structure of traditional random accessible logarithmic active pixel circuit.

Therefore, as shown in FIG. 5 to FIG. 7, when the photoelectric sensor in the embodiment of the present invention works in the off-state region, the output current of the photoelectric sensor can be linearly related to the light intensity of the incident light, and has a 160 dB dynamic range which is higher than that of a traditional CMOS photoelectric sensor. The photoelectric sensor here is in the wide dynamic range mode. When the photoelectric sensor works in the sub-threshold region, the relationship between the output current of the photoelectric sensor and the light intensity of the incident light tends to be linear, and the photoconductive gain can be up to $10^6$-$10^7$. The photoelectric sensor is hereby in high gain mode. Thus, the two operation modes (wide dynamic range mode and high gain mode) of the photoelectric sensor can be tuned by adjusting the gate voltage.

In an embodiment, the substrate may be a lightly doped silicon wafer or a silicon epitaxial layer substrate.

In an embodiment, in order to reduce the size of the entire photoelectric sensor and increase the photosensitive area, the electrode layer on the bottom surface of the doped region is used as the cathode. Therefore, a transparent electrode layer is adopted in an embodiment to reduce the incident light absorption loss of the photodiode.

It should be noted that various technical features in the above embodiments can be combined freely, as long as there is no conflict or contradiction between the combinations of these features. Here will not describe all embodiments exhaustively.

On the basis of the aforementioned photoelectric sensor, an embodiment of the present invention further provides a random accessible active pixel circuit to solve at least several disadvantages of traditional active pixel circuit, as follows:

Firstly, as shown in FIG. 3, a traditional random accessible logarithmic active pixel circuit with a wide dynamic range comprises three field-effect transistors and a traditional photodiode. The three field-effect transistors are a reset transistor Trst, a source follower Tsf and a selection transistor Tsel, respectively. The traditional random accessible logarithmic active pixel circuit can be random accessible, and its output signal can vary with the light intensity logarithmically. Thus, the circuit has a wide dynamic range which can be more than 100 dB. In addition, the traditional random accessible logarithmic active pixel circuit does not need to be reset, so the pixel fill factor is large, and the operation is fast and simple. Meanwhile, each pixel in the traditional random accessible logarithmic active pixel circuit works independently, and the photoelectric conversion process does not take the time integral of the photo charge, so it can be read randomly in space and time domain. The random accessibility in space domain allows important signals to be read and processed independently, making the sensor more intelligent. While the random accessibility in time domain makes the signals read and processed more quickly. In this way, the random accessibility in space and time domain has the advantages of faster processing of the important data independently. However, the output signal of the traditional random accessible logarithmic active pixel circuit decreases as the light intensity increases, making the back-end signal readout circuit needs to be redesigned. Moreover, as the output of the traditional random accessible logarithmic active pixel circuit has a logarithmic relationship with its input, the sensitivity of the sensor is relatively low under low light intensity. It is difficult to reduce the pixel size due to the three-transistor design, and the spatial resolution is also limited.

Figure 9:
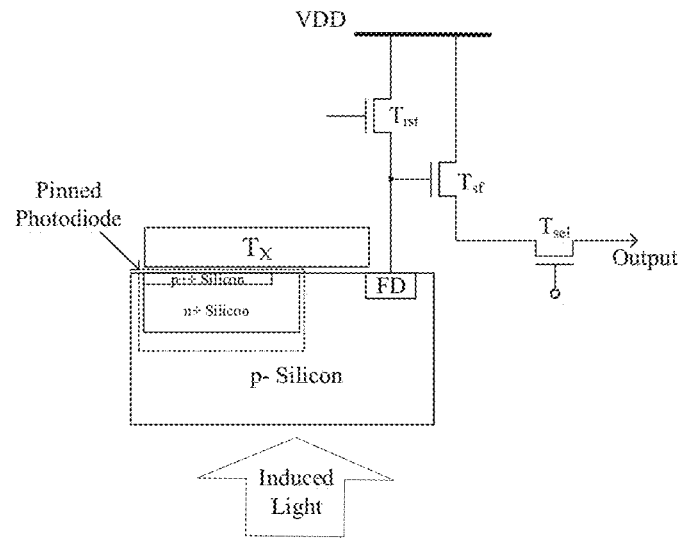
FIG. 9 is a schematic diagram of the structure of traditional back-side illumination active pixel circuit.

Secondly, as shown in FIG. 9, a traditional back-side illumination active pixel circuit is an active pixel circuit comprising four transistors (4T-APS), i.e., a pinned photodiode (PPD), a transmission transistor Tx, a reset transistor Trst, a source follower Tsf, and a selection transistor Tsel. As compared with the Front-Side Illumination (FSI) structure, the back-side illumination structure has a larger photosensitive area and fill factor. Therefore, the quantum efficiency and sensitivity of the sensor are improved. However, the 4T-APS circuit structure is complex, and the pixel needs a reset-integration-read sequential operation, which is not random accessible. Besides, it has to make a trade-off between the high sensitivity and wide dynamic range.

It can be concluded from the above that the technical problems solved by the present invention includes: avoiding the redesign of the signal readout and processing circuit of the traditional random accessible logarithmic active pixel circuit; low sensitivity under low light intensity; limited spatial resolution because of the difficulty in reducing the pixel size due to the three-transistor design; complexity of design, failure of random accessibility, and trade-off between high sensitivity and wide dynamic range in the 4T-APS back-side illumination active pixel circuit sensor.

Figure 10:
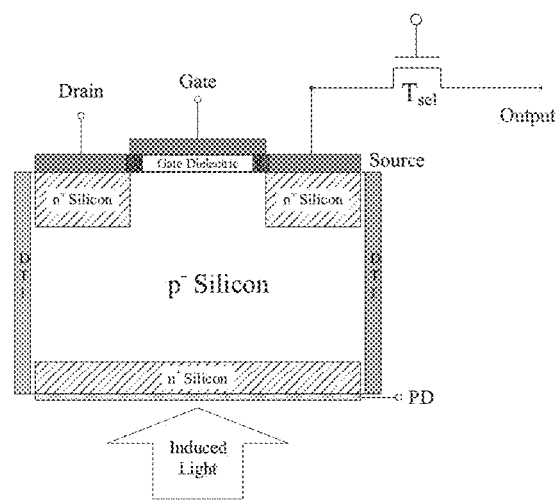
FIG. 10 is a schematic diagram of the structure of random accessible active pixel circuit according to an embodiment of the present invention.
Figure 11:
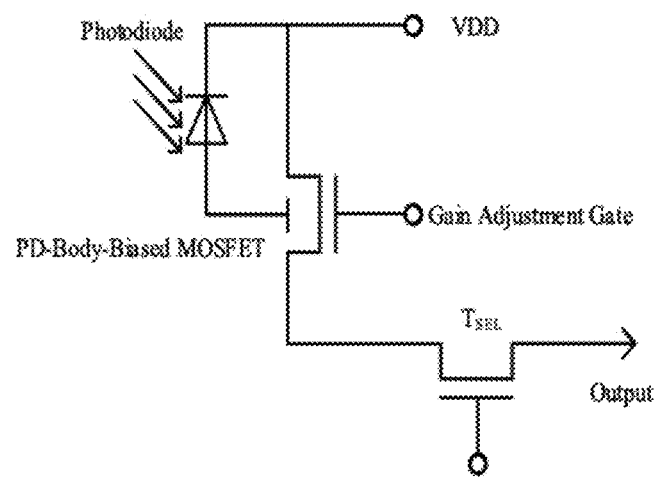
FIG. 11 is an equivalent circuit diagram of the random accessible active pixel circuit shown in FIG. 10.

In order to overcome the aforementioned drawbacks in the traditional photo sensor, the embodiment of the present invention adopts a selection transistor and the photoelectric sensor described in any of the above embodiments as shown in FIG. 10 and FIG. 11. The drain of the selection transistor is electrically connected to the source of the photoelectric sensor and the source of the selection transistor serves as the output of the circuit. The gate of the selection transistor is biased with a positive voltage/a negative voltage to turn-on/turn-off the circuit. The cathode and the drain are connected in series in the photoelectric sensor.

It is noted that when the field-effect transistor in the photoelectric sensor works in the off-state region, its output current is linearly related with the incident light intensity, and the dynamic range can reach more than 160 dB. When the field-effect transistor in the photoelectric sensor works in the sub-threshold region, the output current tends to be linearly related with the incident light intensity, and the optical gain can reach $10^6$-$10^7$. Therefore, the operating modes of the photoelectric sensor can be adjusted by tuning the gate voltage of the field-effect transistor of the photoelectric sensor. Therefore, in the embodiment of the present invention, the random accessible active pixel circuit comprising the photoelectric sensor in the above embodiments has at least the following technical benefits:

On one hand, the dynamic range of the random accessible active pixel circuit in the present invention can be up to 160 dB, which is much higher than that of the traditional random accessible logarithmic active pixel circuit. Thus, the sensor can produce a distinguishable output signal even under a very low light intensity. Therefore, it is not necessary to take the integral of the photo charge and do a reset of the photodiode, making the device simple to be random accessible.

On the other hand, the random accessible active pixel circuit in the embodiment of the present invention comprises two transistors only and can realize the functions of photoelectric detection, amplification and readout, as compared with the traditional random accessible logarithmic active pixel circuit and the back-side illumination active pixel circuit having a 4T-APS structure. Therefore, the embodiment of the present invention has the advantages of high spatial resolution with reduced pixel size. The embodiment of the present invention has the properties of high gain and wide dynamic range.

It is noted that the random accessible active pixel circuit in the embodiment of the present invention includes a wide dynamic range mode and a high gain mode.

The following describes how the random accessible active pixel circuit of the embodiment of the present invention switch the operating modes.

First, a wide dynamic range mode
a driving process to make the circuit in a wide dynamic range mode including steps of:
applying a voltage to the cathode of the photoelectric sensor to make the photodiode work in a reverse saturation region;
adjusting the voltage applied to the gate of the photoelectric sensor to make the field-effect transistor work in an off-state region;
when the light irradiates the back-side of the substrate of the photoelectric sensor, a photocurrent is generated in the photodiode, and the output current of the circuit is linearly related with the light intensity. The operating mode of the circuit is hereby a wide dynamic range mode.

Second, a high gain mode
a driving process to make the circuit in a high gain mode including steps of:
applying a voltage to the cathode of the photoelectric sensor to make the photodiode work in a reverse saturation region;
adjusting the voltage applied to the gate of the photoelectric sensor to make the field-effect transistor work in the sub-threshold region;
when the light irradiates the back-side of the substrate of the photoelectric sensor, a photocurrent is generated in the photodiode, and the output current of the circuit tends to be linearly related with the light intensity. The operating mode of the circuit is hereby a high gain mode. The sentence "tends to be linearly related" should be interpreted as an approximate linear relationship.

It should be noted that when the random accessible active pixel circuit is in any of the above operating modes, it is in a turn-on state, that is, connecting the gate of the selection transistor to a positive voltage, the selection transistor which serves as a switch is turned on, thereby turning on the circuit. When the random accessible active pixel circuit needs to be disconnected, a negative voltage can be connected to the gate of the selection transistor, so that the selection transistor which serves as a switch is turned off, thereby turning off the circuit.

In the embodiment, the selection transistor is a field-effect transistor.

The present invention further provides an image sensor corresponding to the random accessible active pixel circuit described in the above embodiments. The image sensor comprises the aforementioned random accessible active pixel circuit. In addition to the random accessible active pixel circuit, the image sensor further comprises other essential and necessary structures, which will not be described in detail here.

The present invention further provides a camera corresponding to the above image sensor. The camera comprises the aforementioned image sensor. In addition to the image sensor, the camera further comprises other essential and necessary structures, for example, lens and screen, which will not be described in detail here.

The embodiment described hereinbefore is merely preferred embodiment of the present invention and not for purposes of any restrictions or limitations on the invention. It will be apparent that any non-substantive, obvious alterations or improvement by the technician of this technical field according to the present invention may be incorporated into ambit of claims of the present invention.

What is claimed is:

1. A photoelectric sensor, comprising:
a doped region;
a substrate;
a doped source region;
a doped drain region; and
two isolation regions,
wherein the doped region is arranged on a bottom surface of the substrate to form a photodiode,
wherein a cathode of the photodiode is formed in the doped region and is connected to a positive voltage to make the photodiode work in a reverse bias region,
wherein the doped source region and the doped drain region are spaced apart on top of the substrate to form a field effect transistor,
wherein a source is formed on a top surface of the doped source region, and a drain is formed on the top surface of the doped drain region,
wherein the two isolation regions are arranged on opposite sides of the substrate, and extend from the doped source region and the doped drain region to the doped region, to isolate adjacent pixels or adjacent sensors,
wherein a gate dielectric layer and a gate between the doped source region and the doped drain region are configured to extend sequentially upwards from the top surface of the substrate, and
wherein the gate is connected to a voltage to make the field effect transistor work in a wide dynamic range mode or a high gain mode.

2. The photoelectric sensor of claim 1, wherein the cathode is formed by an electrode layer plated on the bottom surface of the doped region.

3. The photoelectric sensor of claim 2, wherein the electrode layer is a transparent electrode layer.

4. The photoelectric sensor of claim 1, wherein, when the substrate is a P-type substrate, the doped region, the doped source region and the doped drain region are all N-type heavily doped regions; and, when the substrate is a N-type substrate, the doped region, the doped source region and the doped drain region are all P-type heavily doped regions.

5. The photoelectric sensor of claim 1, wherein the substrate is one of a lightly doped silicon wafer substrate or a silicon epitaxial layer substrate.

6. A random accessible active pixel circuit, comprising:
a selection transistor; and
a photoelectric sensor,
wherein the photoelectric sensor comprises a doped region, a substrate, a doped source region, a doped drain region, and two isolation regions,
wherein the doped region is arranged on a bottom surface of the substrate to form a photodiode,
wherein a cathode of the photodiode is formed in the doped region and is connected to a positive voltage to make the photodiode work in a reverse bias region,
wherein the doped source region and the doped drain region are spaced apart on top of the substrate to form a field-effect transistor,
wherein a source is formed on a top surface of the doped source region, and a drain is formed on the top surface of the doped drain region,
wherein the two isolation regions are arranged on opposite sides of the substrate, and extend from the doped source region and the doped drain region to the doped region, to isolate adjacent pixels or adjacent sensors,
wherein a gate dielectric layer and a gate between the doped source region and the doped drain region are configured to extend sequentially upwards from the top surface of the substrate,
wherein the gate is connected to a voltage to make the field-effect transistor work in a wide dynamic range mode or a high gain mode, and
wherein the drain of the selection transistor is electrically connected to the source of the photoelectric sensor, the source of the selection transistor serves as an output of the random accessible active pixel circuit, and the gate of the selection transistor is used to connect with a positive voltage to turn-on the random accessible active pixel circuit or connect with a negative voltage to turn-off the random accessible active pixel circuit; in the photoelectric sensor, the cathode and the drain are connected in series.

7. The random accessible active pixel circuit of claim 6, wherein the cathode is formed by an electrode layer plated on the bottom surface of the doped region.

8. The random accessible active pixel circuit of claim 7, wherein the electrode layer is a transparent electrode layer.

9. The random accessible active pixel circuit of claim 6, wherein, when the substrate is a P-type substrate, the doped region, the doped source region and the doped drain region are all N-type heavily doped regions, and, when the substrate is an N-type substrate, the doped region, the doped source region and the doped drain region are all P-type heavily doped regions.

10. The random accessible active pixel circuit of claim 6, wherein the substrate is one of a lightly doped silicon wafer substrate or a silicon epitaxial layer substrate.

11. The random accessible active pixel circuit of claim 6, wherein when an operating mode of the random accessible active pixel circuit comprises a wide dynamic range mode, a driving process to make the random accessible active pixel circuit in a wide dynamic range mode comprises:
applying a voltage to the cathode of the photoelectric sensor to make the photodiode work in a reverse saturation region; and
adjusting the voltage applied to the gate of the photoelectric sensor to make the field effect transistor work in an off-state region, and
wherein, when the light irradiates a back-side of the substrate of the photoelectric sensor, a photocurrent is generated in the photodiode, and an output current of the random accessible active pixel circuit is linearly related with the light intensity, the operating mode of the random accessible active pixel circuit is a wide dynamic range mode.

12. The random accessible active pixel circuit of claim 6, wherein when the operating mode of the random accessible active pixel circuit further comprises a high gain mode, a driving process to make the random accessible active pixel circuit in a high gain mode comprises:

applying a voltage to the cathode of the photoelectric sensor to make the photodiode work in a reverse saturation region; and adjusting the voltage applied to the gate of the photoelectric sensor to make the field effect transistor work in a sub-threshold region, and wherein, when the light irradiates a back-side of the substrate of the photoelectric sensor, a photocurrent is generated in the photodiode, and an output current of the random accessible active pixel circuit is substantially linearly related with the light intensity, the operating mode of the random accessible active pixel circuit is a high gain mode.

13. An image sensor comprising:
a random accessible active pixel circuit,
wherein the random accessible active pixel circuit comprises a selection transistor and a photoelectric senor,
wherein the photoelectric sensor comprises a doped region, a substrate, a doped source region, a doped drain region, and two isolation regions;
wherein the doped region is arranged on a bottom surface of the substrate to form a photodiode,
wherein a cathode of the photodiode is formed in the doped region and is connected to a positive voltage to make the photodiode work in a reverse bias region,
wherein the doped source region and the doped drain region are spaced apart on top of the substrate to form a field effect transistor,
wherein a source is formed on a top surface of the doped source region, and a drain is formed on the top surface of the doped drain region,
wherein the two isolation regions are arranged on opposite sides of the substrate, and extend from the doped source region and the doped drain region to the doped region, to isolate adjacent pixels or adjacent sensors,
wherein a gate dielectric layer and a gate between the doped source region and the doped drain region are configured to extend sequentially upwards from the top surface of the substrate, wherein the gate is connected to a voltage to make the field effect transistor work in a wide dynamic range mode or a high gain mode, and wherein the drain of the selection transistor is electrically connected to the source of the photoelectric sensor, the source of the selection transistor serves as an output of the random accessible active pixel circuit, and the gate of the selection transistor is used to connect with a positive voltage to turn-on the random accessible active pixel circuit or connect with a negative voltage to turn-off the random accessible active pixel circuit; in the photoelectric sensor, the cathode and the drain are connected in series.

14. The image sensor of claim 13, wherein an operating mode of the circuit comprises a wide dynamic range mode, a driving process to make the random accessible active pixel circuit in a wide dynamic range mode comprises:

applying a voltage to the cathode of the photoelectric sensor to make the photodiode work in a reverse saturation region; and adjusting the voltage applied to the gate of the photoelectric sensor to make the field-effect transistor work in an off-state region, and wherein, when light irradiates a back-side of the substrate of the photoelectric sensor, a photocurrent is generated in the photodiode, and an output current of the random accessible active pixel circuit is linearly related with intensity of the light.

15. The image sensor of claim 13, wherein the operating mode of the random accessible active pixel circuit comprises a high gain mode, a driving process to make the random accessible active pixel circuit in a high gain mode comprising:

applying a voltage to the cathode of the photoelectric sensor to make the photodiode work in a reverse saturation region; and adjusting the voltage applied to the gate of the photoelectric sensor to make the field-effect transistor work in a sub-threshold region, and wherein, when light irradiates a back-side of the substrate of the photoelectric sensor, a photocurrent is generated in the photodiode, and an output current of the random accessible active pixel circuit is substantially linearly related with intensity of the light.

16. A camera comprising the image sensor of claim 13.

* * * * *